(12) United States Patent
Korsunsky et al.

(10) Patent No.: US 7,351,071 B2
(45) Date of Patent: Apr. 1, 2008

(54) HIGH DENSITY, HIGH SPEED CONNECTOR

(75) Inventors: Iosif R. Korsunsky, Harrisburg, PA (US); Brian J. Gillespie, Harrisburg, PA (US); Lewis R. Johnson, Dover, PA (US); Joanne E. Shipe, Harrisburg, PA (US); Kevin E. Walker, Hershey, PA (US); Robert W. Brown, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/476,297

(22) Filed: Jun. 28, 2006

(65) Prior Publication Data

US 2007/0087590 A1 Apr. 19, 2007

Related U.S. Application Data

(63) Continuation-in-part of application No. 11/251,126, filed on Oct. 14, 2005, now Pat. No. 7,097,465.

(51) Int. Cl.
*H01R 12/00* (2006.01)

(52) U.S. Cl. .................................................. 439/74
(58) Field of Classification Search .................. 439/65, 439/74, 83, 744, 746, 747, 748
See application file for complete search history.

(56) References Cited

U.S. PATENT DOCUMENTS

| | | | |
|---|---|---|---|
| 4,992,056 A * | 2/1991 | Douty et al. | 439/83 |
| 5,137,462 A * | 8/1992 | Casey et al. | 439/74 |
| 6,241,535 B1 * | 6/2001 | Lemke et al. | 439/83 |

* cited by examiner

*Primary Examiner*—Ross Gushi
(74) *Attorney, Agent, or Firm*—Wei Te Chung (57) ABSTRACT

A high density, high speed, low profile, electrical connector (100) includes a housing (10) and conductive contacts (20) partially positioned in the housing. The housing has a base (11) defining therethrough a number of passageways (114). Each contact has a body portion (21) and a pair of cantilevered beams (22) extending from the body portion. A retaining tab (212) is stamped from the body portion and abuts against a projection (116) formed in the passageway for protect the housing from possible movement with respect to a board on which the connector is mounted. The connector also has a stabilizer (30) assembled to the housing.

14 Claims, 7 Drawing Sheets

HIGH DENSITY, HIGH SPEED CONNECTOR

CROSS-REFERENCE TO RELATED APPLICATIONS

This application is a Continuation-In-Part of U.S. patent application Ser. No. 11/251,126, filed on Oct. 14, 2005 now U.S. Pat. No. 7,097,465, entitled "HIGH DENSITY CONNECTOR WITH ENHANCED STRUCTURE; which is assigned to the same assignee with this application.

BACKGROUND OF THE INVENTION

1. Field of the Invention

The present invention generally relates to a low profile electrical connector for interconnecting two printed circuit boards, and particularly to a high speed, high density connector having improved contact structure for insuring a reliable signal transmission.

2. Description of Related Art

Continued advances in the design of electronic devices for data processing and communications systems have placed rigorous demands on the design of electrical connectors. Specifically, electrical connectors having higher densities and pin counts require careful consideration of the problems which result from decreasing the distance between contacts. Understandably, greater density cannot sacrifice electrical or mechanical performance of a connector.

A difficulty in designing high density connectors having a low-mated height is in maintaining proper alignment of the contact elements of engaged connectors so as to insure reliable electrical connections therebetween. U.S. Pat. Nos. 6,042,389, 6,093,035, 6,471,526, and 6,558,170, issued to Lemke et al. and Harper, disclose high-density, high-speed, board-to-board connectors. These connectors have a respective receptacle and a respective plug. The receptacle includes a receptacle housing receiving therein a number of receptacle contacts coupled to a first substrate, while the plug includes a plug housing receiving therein a number of plug contacts coupled to a second substrate and establishing electrical connection with receptacle contacts of the receptacle. However, the problem to maintain proper alignment of contacts during mating procedure is not solved and no particular enhanced structure is provided to insure a reliable electrical connection from the first substrate to the second substrate.

With the increased demands for miniaturization of the data processing and communication systems, another design problem resulting from high density, low-mated height connectors is that the tiny, slender contact elements are susceptible to damage if used improperly. U.S. Pat. Nos. 6,471,526 and 6,558,170 disclose two-beam contacts resided within apertures of the housing. The contacts have upper arms flexibly connected to tail portions. Upper arms have a converging section and an outwardly diverging lead-in section. As plug and receptacle mate, upper portions of plug contacts flexibly engage upper arms of receptacle contacts, which accept upper portions of the plug contacts into outwardly diverging lead-in sections. Referring particularly to figures of the cited patents, it is easy to see that the upper arms of the receptacle contacts extend beyond a relatively large distance from a mating face of the receptacle. When engaging with the plug, the receptacle contacts will be liable to deformation for flexibility. On the other hand, it brings difficulties to align the plug contact with the receptacle contacts thereby effecting reliablity of electrical connections therebetween. If one or more of the receptacle beams are out of position, it is very easy for the corresponding plug blades to fail to mate properly.

Still a bottle-neck in disclosed high speed, high density, low profile connector design is in that the housing is subject to detaching from the contacts during un-mating of the plug and the receptacle.

Hence, a low profile electrical connector with enhanced structure and excellent contact stability is highly desired.

BRIEF SUMMARY OF THE INVENTION

Accordingly, it is an object of the present invention to provide a high density, low profile connector with improved contacts to protect the housing from possible detaching from contacts during disengaging from the mated connector.

In order to achieve the above-mentioned object, a high density, high speed, low profile, electrical connector includes a dielectric housing and a plurality of conductive contacts partially positioned in the housing. The housing has a base defining therethrough a plurality of passageways. Each contact has a body portion and a pair of cantilevered beams extending from the body portion. A retaining tab is stamped from the body portion and abuts against a projection formed in the passageway for protect the housing from possible movement with respective to a board on which the connector is mounted. The connector also has a stabilizer assembled to the housing for protecting and supporting the contacts.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Reference will now be made to the drawing figures to describe the present invention in detail.

Figure 1:
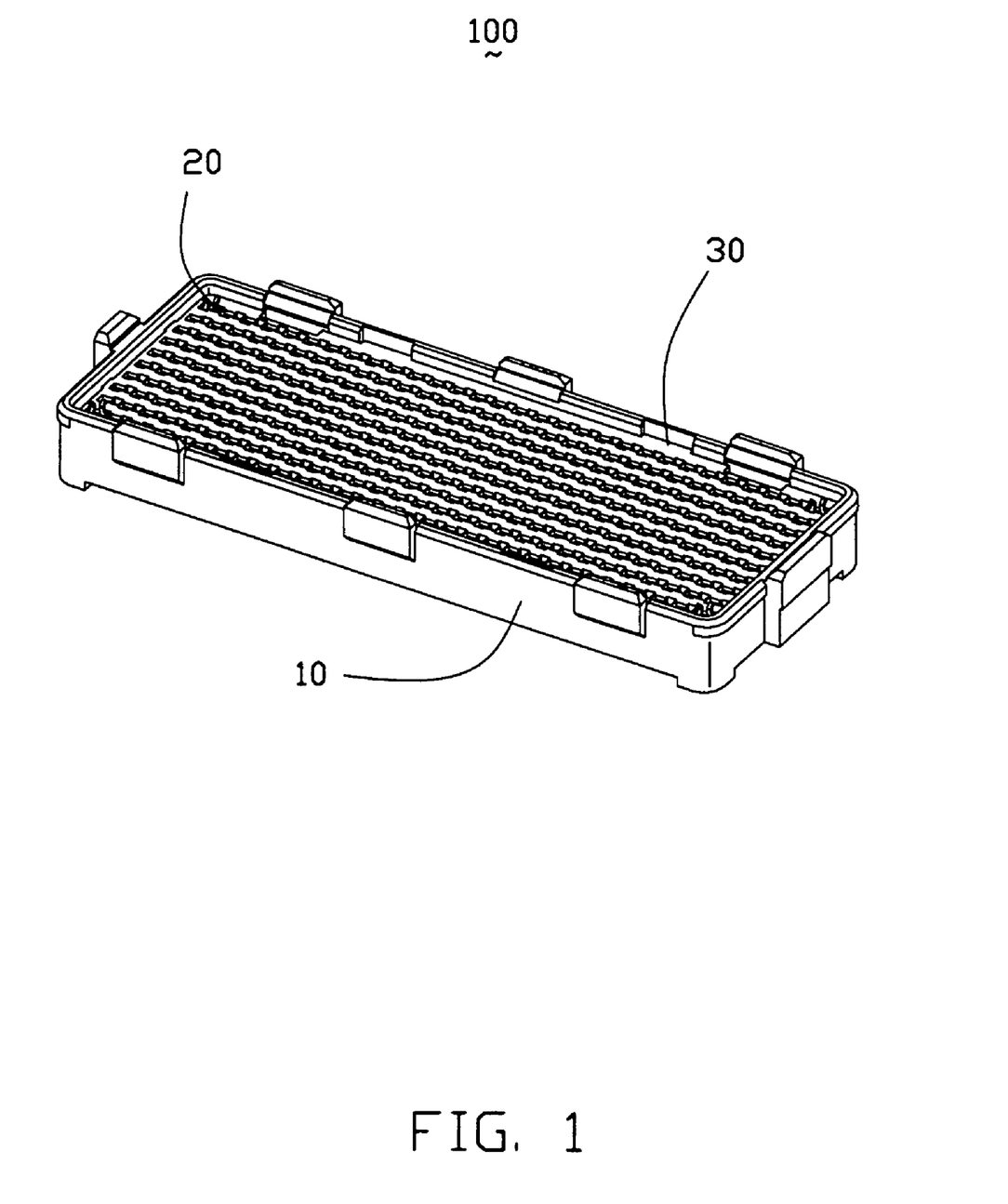
FIG. 1 is a perspective view of a receptacle connector in accordance with the present invention.
Figure 2:
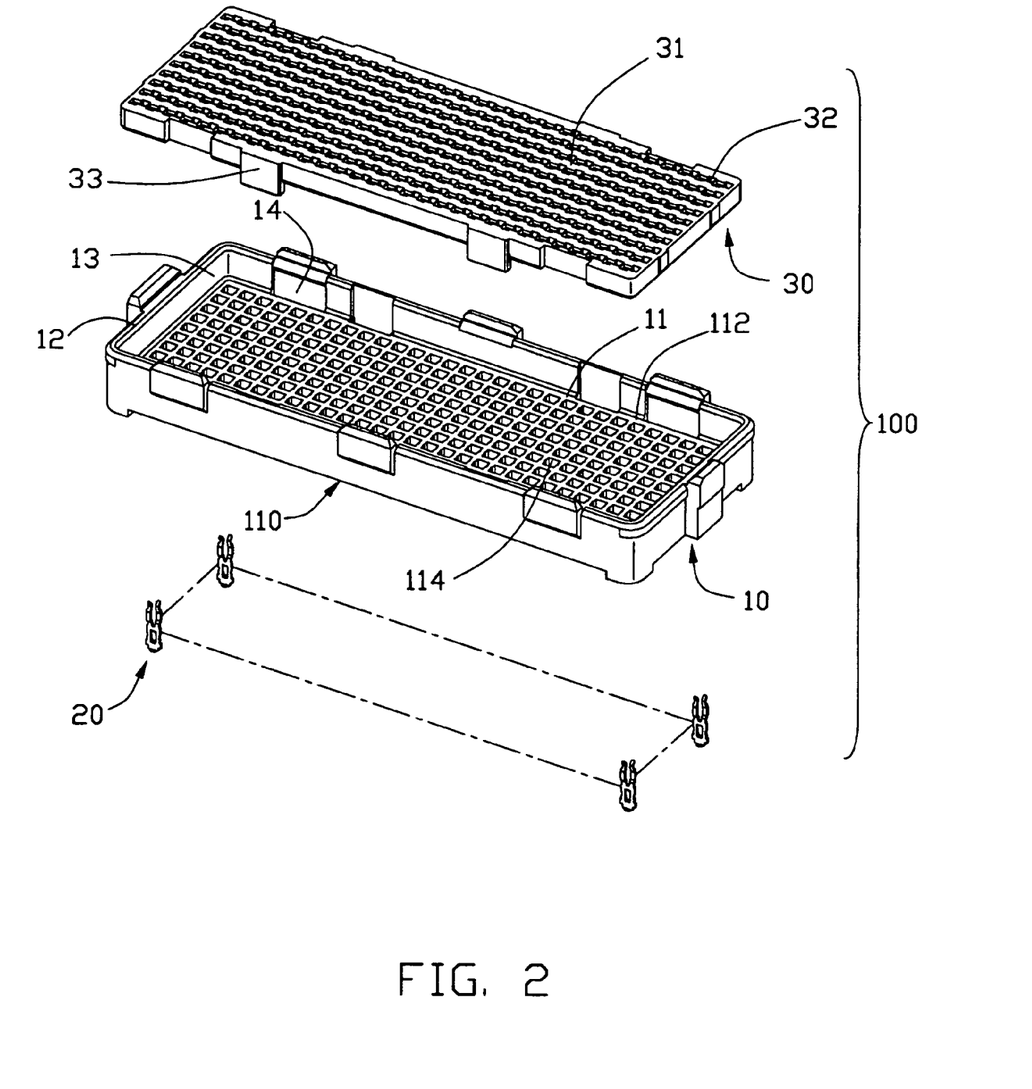
FIG. 2 a perspective view of the receptacle with a stabilizer and some contacts being disassembled therefrom.

With reference to FIGS. 1-2, a receptacle connector 100 in accordance with the present invention, which is adapted for mounting on a circuit board, comprises a dielectric housing 10, a plurality of conductive receptacle contacts 20 received in the housing 10, and a stabilizer 30 detachably assembled onto the housing 10. The dielectric housing 10 has a base 11, described throughout as a plate, side walls 12 extending upwardly from periphery edges of the base plate 11, and a receiving cavity 13 defined therebetween which provides space for receiving the stablizer 30 and a complementary plug (not shown).

The base plate 11 has a lower mounting face 110 confronting to the circuit board, a parallel, upper receiving face 112, opposite to the mounting face 110 and confronting to the stablizer 30, and a plurality of passageways 114 extending through the base plate 11 from the mounting face 110 to the receiving face 112. The passageways 114 are arranged in multiple rows and columns for receiving corresponding conductive contacts 20. Only a few of conductive receptacle contact 20 are shown for simplicity.

FIGS. 3-6 respectively illustrate one example receptacle contact 20, which is received in a corresponding passageway 114 of the dielectric housing 2. The contact 20 has a rectangular body portion 21, a pair of cantilevered beams 22 extending upwardly from a top edge of the body portion 21, and a platform 23 formed in a bottom edge of the body portion 21. The platform 23 is configured for being attached thereon a solder ball (not shown) so that soldering the contact 20 to a conductive pad of the circuit board on which the receptacle connector is mounted. The body portion 21 is provied with a plurality of barbs or ribs 210 along two opposite lateral edges thereof for interference fit in corresponding passageway 114 of the housing 10. Each cantilevered beam 22 is provided with a contact end 220 for electrical contact with a plug contact of the mating plug. The body portion 21 is also provided with a retaining tab or a lance 212 stamped therefrom for engaging to a corresponding portion of the housing, which will be detailedly described hereinbelow. It can be seen that, in the perferred embodiment, the body portion 21 is partially received in the passageway 114 with a top section thereof extending upwardly beyond the receiving face 112 of the housing 10. It should be noted here that, in the preferred embodiment, each root 222 of the two cantilevered beams 22 is located above the receiving face 112 of the housing 10.

Figure 4:
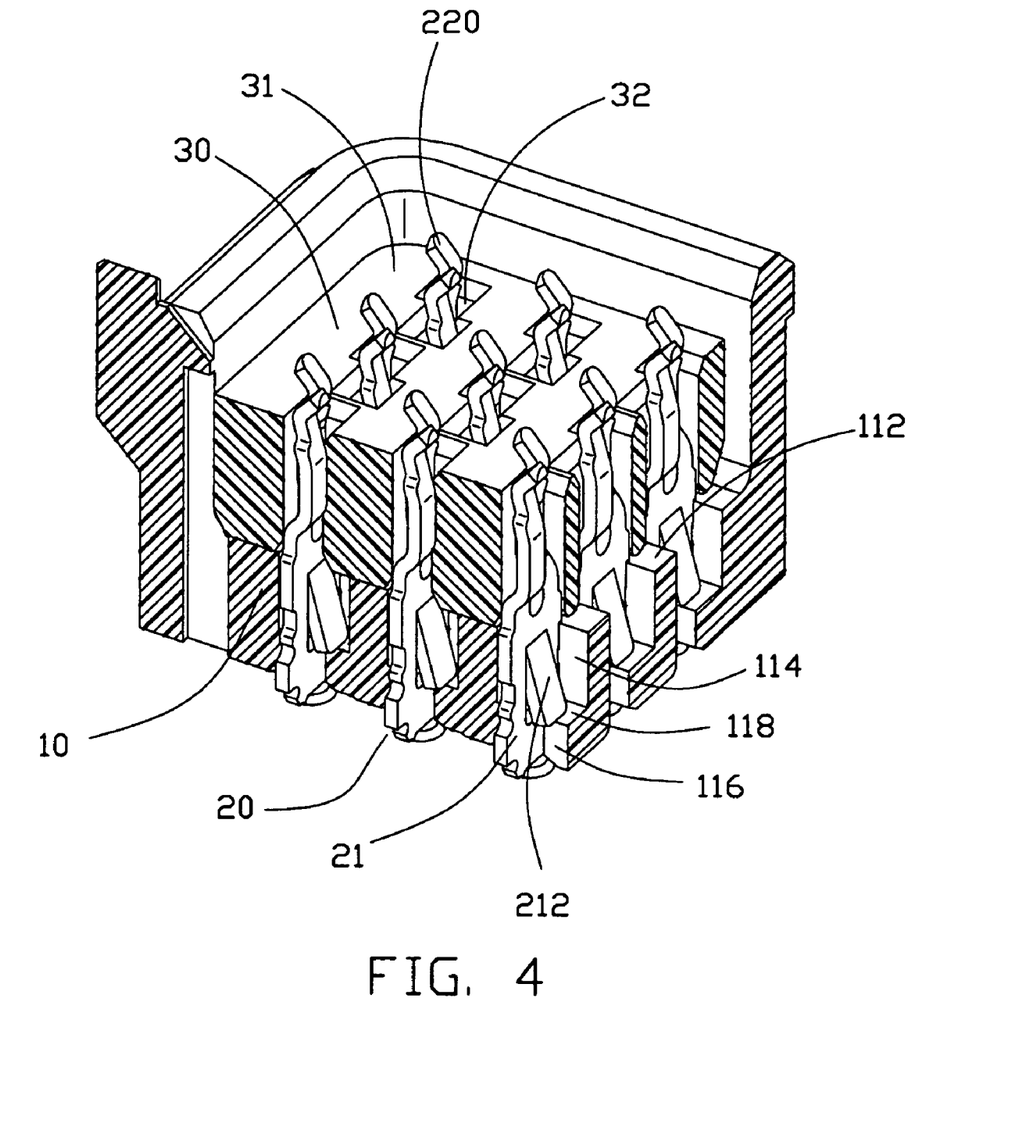
FIG. 4 is an enlarged, partial view of the receptacle.
Figure 5:
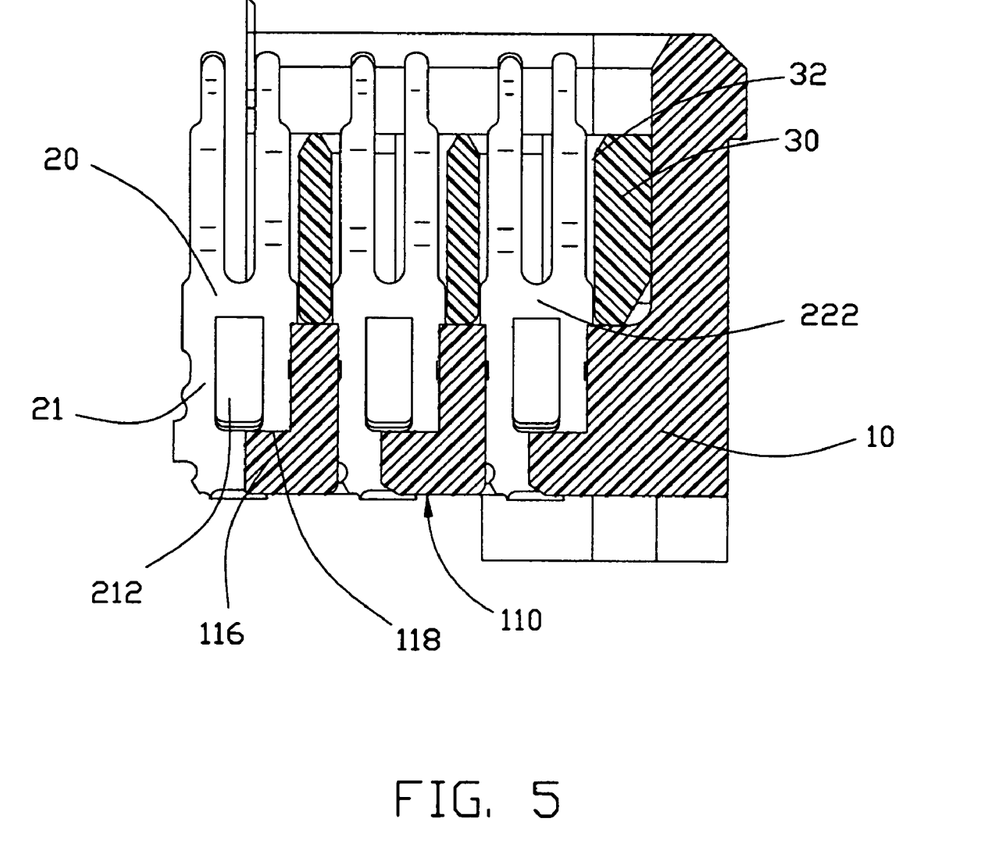
FIG. 5 is a partial, cross-section view of the connector showing the contact extending within a housing and the stabilizer.
Figure 6:
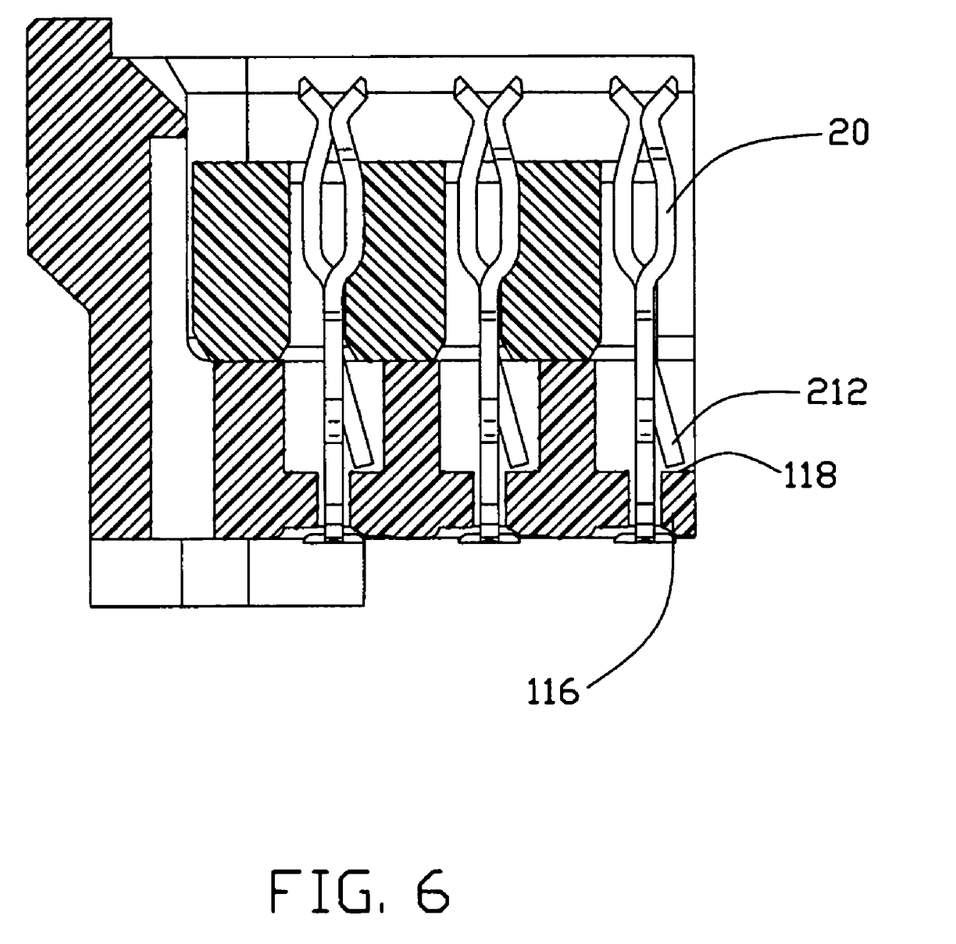
FIG. 6 is a view similar to FIG. 5 while from a different aspect.
Figure 7:
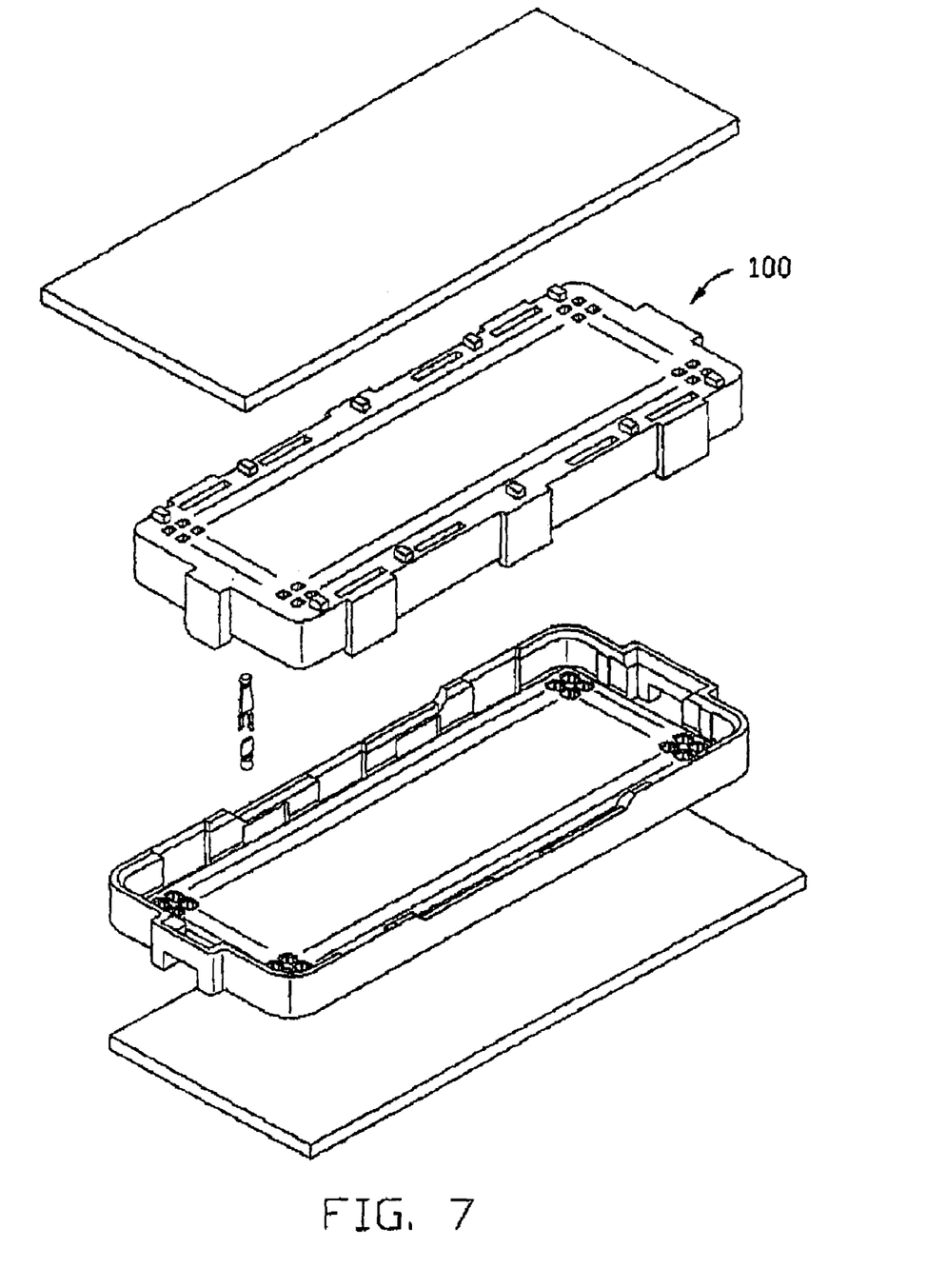
FIG. 7 is a digrammatic sketch showing a connector assembly including the receptacle connector, a complementary plug and boards on which the receptacle and the plug are mounted.

Particularly referring to FIGS. 4-6, the receptacle contacts 20 received in the corresponding passageways 114 of the housing 10 and cavities 32 of the stabilizer 30 are shown in details. Each passageway 114 is provided with a projection 116 protruded inwardly from an inner side face thereof with a retaining face 118 formed thereon. In the preferred embodiment, the projection 116 is formed adjacent to the mounting face 110 and an S-shaped opening (not shown) can be seen from a bottom view of the housing 10. Specifically, the retaining tab 212 extends slantedly downwardly from the body portion 21 of the contact 20 and a distal end thereof abuts against the retaining face 118 of the projection 116. Clearly, contact lance-out prevents the housing 10 divorcing from press-fit contacts during unmating of the plug and the receptacle. Notes that other structure can be also employed to prevent the housing from divorcing from the contacts. Also, in the preferred embodiment, said contacts 20 are assembled to said housing 10 from a bottom side thereof.

Figure 3:
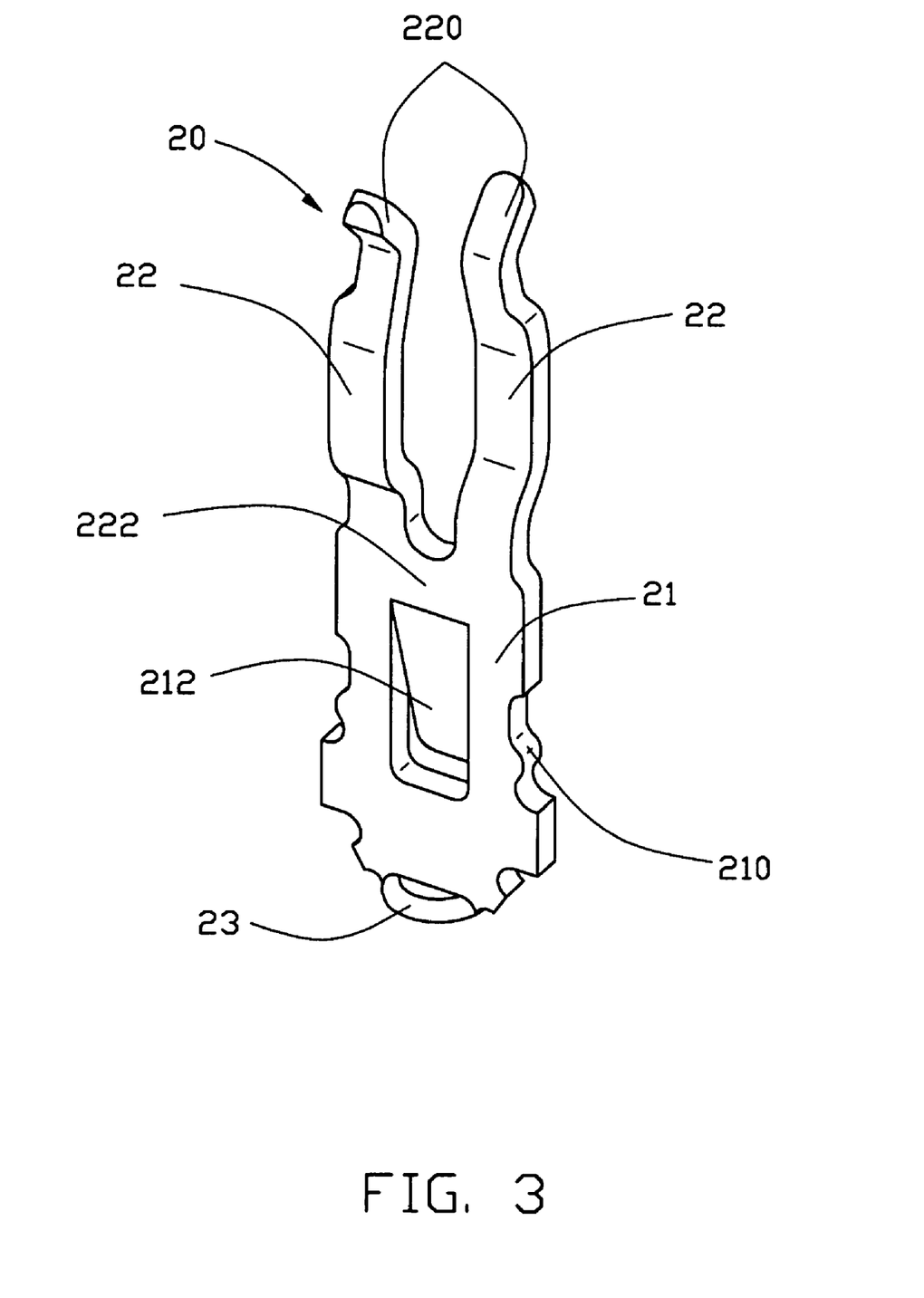
FIG. 3 is a perspective view of the contact.

Turn to FIG. 2 in conjunction with FIGS. 1 and 3, the stabilizer 30 is configured as a substantially planar plate with a flat planar mating surface 31 on a top. The stabilizer 30 has a plurality of S-shaped cross-section cavities 32 defined therethrough. The cavities 32 are arranged in columns and rows in correspondence to passageways 114 of the housing 10. The beams 22 of the contacts 20 are substantially received in the cavities 32 with contact ends 220 projecting outside the mating surface 31 (see FIG. 4). There are press-fit type, retaining latches or locks 33 formed at a periphery thereof for engaging with corresponding recesses 14 defined in the housing 2 to thereby secure the stabilizer 30 onto the housing 10. Understandably, other structure which can firmly latch the stabilizer 30 and the housing 10 also falls in the scope of the present invention.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A high density electrical connector with a low profile, comprising:

a first housing defining a plurality of passageways extending therethrough, each passageway forming a retaining portion therein;

a second housing attached to said first housing, said second housing defining a plurality of cavities corresponding to said passageways; and conductive contacts arranged in rows and columns, each comprising a body portion secured in said passageway and a contact portion extending away from said passageway; wherein each contact forms a retaining tab abutting against said retaining portion for preventing a divorcing of said housing from said contacts;

wherein said second housing is formed as a flat rectangular board having a planar surface confronting to a top of said first housing and each of said cavities of said second housing has an S-shaped cross section.

2. An electrical connector as described in claim 1, wherein said retaining tab is stamped from said body portion of said contact and extends slantedly towards said retaining portion.

3. An electrical connector as described in claim 2, wherein said retaining portion is formed adjacent to a bottom of said first housing and has a retaining face formed therewith.

4. An electrical connector as described in claim 1, wherein said contact portions of the contacts extend through said cavities of said second housing and project outside thereof.

5. An electrical connector as described in claim 1, wherein said second housing forms a plurality of retaining members and said first housing defines a plurality of recesses engaging with said retaining members for securely assembly said first and second housings together.

6. An electrical connector as described in claim 1, wherein said first housing has a receiving opening for receiving said second housing.

7. An electrical connector as described in claim 1, wherein the contact portion of each contact is configured with a pair of fingers for receiving a blade plug contact of a mating plug.

8. An electrical connector as described in claim 1, wherein said body portion of said contact has barbs formed thereon for interference fitting within said passageway.

9. An electrical connector as described in claim 1, wherein said first housing has a rectangular base with said passageways extending therethrough and side walls extending perpendicularly from said base wall.

10. An electrical connector assembly comprising:

a first and a second boards extending parallel to each other with conductive pads formed thereon;

a receptacle connector mounted on said first board, said receptacle connector comprising:

a receptacle housing including a general flat base and defining a plurality of passageways extending through said base, each passageway forming a retaining portion;

a plurality of receptacle contacts assembled to said receptacle housing and partially received in corresponding passageways, said contact having a retaining tab resting against said retaining portion for limiting an up-to-down movement of the contact with respect to the housing; and a stabilizer assembled to said receptacle housing and defining two opposite, planar faces and a plurality of cavities, said receptacle contacts projecting through said cavities and extending beyond said planar face of said stabilizer; and a plug mounted on said second board, said plug comprising a plug housing and a plurality of blade contacts received in said plug housing and adapted to engage with said receptacle contacts of said receptacle to thereby establishing an electrical connection between said first and second boards.

11. An electrical connector assembly as described in claim 10, wherein each receptacle contact comprises a body portion, a pair of cantilevered beams projecting from a top of said body portion, and a tail portion adjacent a bottom of said body portion adapted for receiving a fusible element thereon.

12. An electrical connector assembly as described in claim 11, wherein said retaining tab is formed in a stamping process.

13. An electrical connector assembly as described in claim 11, wherein said retaining tab is stamped from said body portion of said receptacle contact and extends slantedly towards said retaining portion.

14. An electrical connector assembly as described in claim 13, wherein said retaining portion is formed adjacent to a bottom of said receptacle housing.

* * * * *